United States Patent [19]
Cheng et al.

[11] 4,001,735
[45] Jan. 4, 1977

[54] SINGLE AMPLIFIER IMMITTANCE NETWORK

[75] Inventors: Rudolph Hon-Ching Cheng; Jin-Twan Lim, both of Kanata, Canada

[73] Assignee: Northern Electric Company Limited, Montreal, Canada

[22] Filed: Nov. 20, 1975

[21] Appl. No.: 633,861

[52] U.S. Cl. .............................. 333/80 R; 307/230; 307/295; 330/107
[51] Int. Cl.² .................. H03H 11/00; H03F 1/36
[58] Field of Search .................... 333/80 R, 80 T; 307/229, 230; 330/107, 109

[56] References Cited
UNITED STATES PATENTS 3,906,390  9/1975  Rollett .............................. 330/107

OTHER PUBLICATIONS

Friend et al., STAR; An Active Biquadratic Filter Section, IEEE Trans. on CS, Feb. 75, pp. 115-121.
Mitra, Active RC Filters Employing A Single Operational Amplifier As The Active Element, Proc. of Hawaii Int'l Conf. on System Sciences, Jan. '68, pp. 433-436.

Primary Examiner—Paul L. Gensler
Attorney, Agent, or Firm—John E. Mowle

[57] ABSTRACT

An active filter which utilizes a single operational amplifier in conjunction with a plurality of resistance-capacitance (R-C) elements, to simulate either an inductance-capacitance (L-C) or a resistance-frequency dependent negative impedance (R-D) network, in which only one impedance constraint must be met in order to realize the network.

8 Claims, 7 Drawing Figures

SINGLE AMPLIFIER IMMITTANCE NETWORK

This invention relates to an immittance simulation network and more particularly to one which utilizes a single operational amplifier together with a plurality of R-C (resistance-capacitance) elements to simulate a series resonant L-C (inductance-capacitance) network, or a series connected R-FDNR (resistance-frequency dependent negative resistance) resonant network. Such networks are particularly suitable for utilization in the realization of high-pass, low-pass or band-pass filters.

BACKGROUND OF THE INVENTION

Discrete components required to realize L-C filters at low frequencies necessitate the use of heavy, bulky and expensive inductors. Recently, the development of integrated circuits has made possible the practical realization of R-C active circuits which simulate these components using generalized-immittance converters (GIC). An excellent series of articles pertaining to this subject is found in the text "Active Inductorless Filters" edited by Sanjit K. Mitra; 1971; IEEE Press, New York. In a separate article entitled: "Active Filter Design Using Generalized Impedance Converters" by Dr. L. T. Bruton and David Treleaven; Electronic Design News, Feb. 5, 1973, pp 68–75, there is described four current-conversion type GIC networks which can be used to simulate inductors or the more recently developed frequency dependent negative resistances (FDNR) which will be identified hereinafter by the symbol "D" (hence: R—FDNR = R—D). Each of these GIC networks utilizes a number of passive components and two operational amplifiers.

One of the prime considerations from both a cost and power consumption viewpoint is the total number of active elements (usually operational amplifiers) required to realize these filter elements. In an article entitled: "Economical RC Active Lossy Ladder Filters" by J. M. Rollett; Electronics Letters, Feb. 8, 1973, Vol. 9 No. 3, pp 70–72, inductive elements are simulated using only one operational amplifier. However, as the title suggests, these elements are lossy in nature and consequently cannot be used to simulate idealized lossless filters. In addition the Q of each of these circuits is related to its inductance and hence cannot be adequately controlled.

In a later article entitled: "New Active-Gyrator Circuit" by H. J. Orchard and A. N. Willson, Jun., Electronics Letters, June 27, 1974, Vol. 10 No. 13, pp 261–262; there is described an R-C active filter which uses a single operational amplifier to simulate an inductor at the grounded port when the non-grounded port is terminated by a capacitor. In a further development described in an article entitled: "Multipurpose Simulation Network With A Single Amplifier" by C. E. Schmidt and M. Lee, Electronics Letters, Vol. 11 No. 1, pp 9 and 10, there is described a simulation network which uses R-C elements in conjunction with a single operational amplifier to simulate R-Ds or L-Rs. While these circuits have several advantages over the prior circuits, they both suffer from the disadvantage that at least two impedance relationships must be met in order to simulate the various elements. Thus, both the Orchard & Willson and Schmidt & Lee networks require at least two impedance cancellations in order to realize the simulated immittances. Consequently, close matching of components is required in order to obtain good performance.

STATEMENT OF THE INVENTION

The present invention utilizes a single operational amplifier together with a plurality of resistors and capacitors to simulate a series L-C network or a R-D network, in which only one constraint or cancellation must be met in order to obtain the desired characteristics.

Thus, in accordance with the present invention there is provided an improved immittance network comprising a single operational amplifier in combination with several passive admittances. In one embodiment, first and second admittances $Y_1$ and $Y_2$ are connected in series between the inverting and non-inverting inputs of the operational amplifier respectively. A third admittance $Y_3$ is connected between the inverting input and the output of the amplifier, while fourth and fifth admittances $Y_4$ and $Y_5$ are connected in series between the non-inverting input and the output of the amplifier respectively. A sixth admittance $Y_6$ is connected between a common terminal of the network and the junction of the fourth and fifth admittances $Y_4$ and $Y_5$, while a seventh admittance $Y_7$ is connected between said junction and the inverting input of the amplifier. In addition, an eighth admittance $Y_8$ is connected between the junction of the first and second admittances and an input terminal of the network. The values of the admittances have the relationship:

$$Z = \frac{1}{Y_8} + \frac{Y_2Y_5Y_7 + Y_2Y_3Y_4 + Y_2Y_3Y_5 + Y_2Y_3Y_7 + Y_2Y_3Y_6 + Y_3Y_4Y_6 - Y_1Y_4Y_5}{Y_3Y_4Y_6(Y_1 + Y_2)}$$

where: $Z$ = the input impedance of the network across said terminals.

In an alternate embodiment which may be used to simulate an R-D network, the admittances $Y_7 = 0$ and $Y_8 = \infty$; the input impedance is then equal to:

$$Z = \frac{Y_2Y_3Y_4 + Y_2Y_3Y_5 + Y_2Y_3Y_6 + Y_3Y_4Y_6 - Y_1Y_4Y_5}{Y_3Y_4Y_6(Y_1 + Y_2)}$$

The circuit lends itself to the use of loose tolerance capacitors and a single off-the-shelf operational amplifier to simulate the admittance of a L-C network, a R-L-C network, a R-D network or a R-D-C network. Typically, the L-C network is used in high-pass filters and the R-D network in low-pass applications, while both may be employed in band-pass cases. In each of these networks, the parameters can be individually adjusted by unidirectionally trimming single resistors thereby avoiding the problem of different impedance scaling for different shunt branches of a filter. Additionally, the Q of the resonant branch can be tuned by trimming one additional resistor. Since only one impedance cancellation is required, the circuit readily lends itself to standard production trimming techniques.

BRIEF DESCRIPTION OF THE DRAWINGS

Example embodiments of the invention will now be described with reference to the accompanying drawings in which.

DESCRIPTION OF THE PREFERRED EMBODIMENTS

Figure 1:
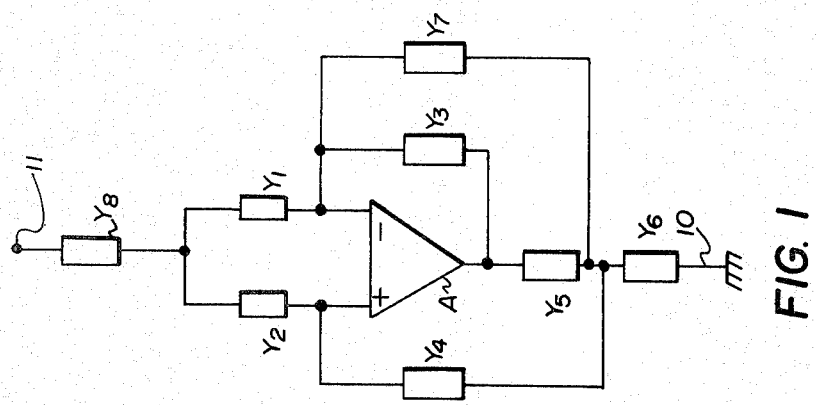
FIG. 1 is a schematic circuit diagram of a generalized immittance network in accordance with the present invention.

Referring to FIG. 1, the generalized immittance network comprises: an operational amplifier A having an inverting input "−" and a non-inverting input "+" and an output. In addition, the network includes a first admittance $Y_1$ and a second admittance $Y_2$ connected in series between the inverting and non-inverting inputs of the amplifier A respectively. A third admittance $Y_3$ is connected between the inverting input and the amplifier output. A fourth admittance $Y_4$ and a fifth admittance $Y_5$ are connected in series between the non-inverting input and the output respectively of the amplifier. A sixth admittance $Y_6$ is connected between a common terminal 10 and the junction of the fourth and fifth admittances. A seventh admittance $Y_7$ is connected between the junction of the fourth and fifth admittances and the inverting input of the amplifier. In addition, an eighth admittance $Y_8$ is connected between the junction of the first and second admittances and an input terminal 11 of the network. For an idealized amplifier A, the admittances are such that the input impedance Z between terminals 10 and 11 is equal to:

$$Z = \frac{1}{Y_8} + \frac{Y_2Y_5Y_7 + Y_2Y_3Y_4 + Y_2Y_3Y_5 + Y_2Y_3Y_7 + Y_2Y_3Y_6 + Y_3Y_4Y_6 - Y_1Y_4Y_5}{Y_3Y_4Y_6(Y_1 + Y_2)}$$

In a practical realization of the immittance network, it will be appreciated that the passive element values will have to be slightly adjusted to compensate for the characteristics of the amplifier A. In addition, it is usually necessary to provide biasing of the operational amplifier A by providing a d-c biasing path to each of the two inputs. As an example, this can be readily achieved by the addition of a very high resistance as illustrated in one of the specific realizations. Such large resistances do not noticeably affect the performance of the immittance network.

It will be understood that the admittances illustrated in this Figure may, in certain applications, be open-circuited, short-circuited as well as series and/or parallel combinations of resistors-capacitors, to simulate other possible immittance networks.

Figure 2:
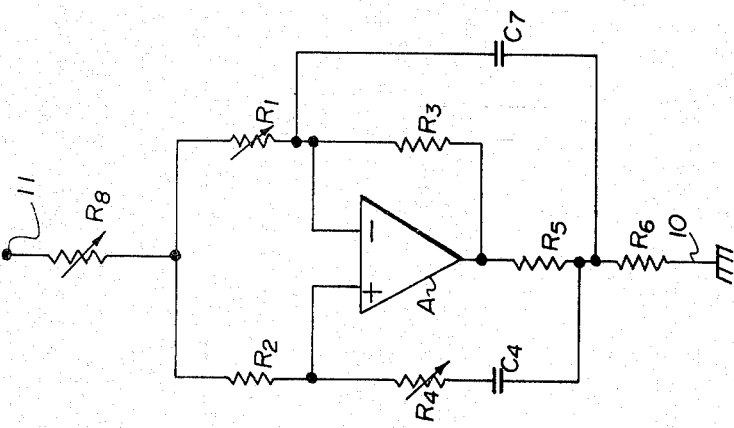
FIG. 2 is a schematic circuit diagram which utilizes one combination of resistors and capacitors for the admittances illustrated in FIG. 1 to simulate a series resonant L-C or L-C-R network.

FIG. 2 illustrates a specific embodiment of the generalized immittance network in which the particular combination of passive elements in conjunction with the operational amplifier simulates an L-C or an L-C-R network depending upon the element values. The resistors and/or capacitors which are used for the admittances shown in FIG. 1 are as follows: the admittance $Y_1$ is a resistor $R_1$; the admittance $Y_2$ is a resistor $R_2$; the admittance $Y_3$ is a resistor $R_3$; the admittance $Y_4$ is a series connected resistor $R_4$ and a capacitor $C_4$; the admittance $Y_5$ is a resistor $R_5$; the admittance $Y_6$ is a resistor $R_6$; the admittance $Y_7$ is a capacitor $C_7$; and the admittance $Y_8$ is a resistor $R_8$.

The realized input capacitance C, inductance L and resistance R of the network between terminals 10 and 11 are as follows:

$$C = \frac{C_4R_5(R_1 + R_2)}{R_1(R_5 + R_6)}$$

$$L = \frac{C_7R_6R_4R_1(R_5 + R_3)}{(R_2 + R_1)R_5}$$

$$R = R_8 + \frac{C_7R_1R_6(R_3 + R_5) + C_4R_1(R_5R_6 + R_4R_6 + R_4R_5) + C_4R_2(R_1R_5 - R_3R_6)}{C_4R_5(R_2 + R_1)}$$

In order to tune the network in a unidirectional manner, the value of the input capacitance C is first adjusted by trimming the resistor $R_1$. Thereafter, the value of the inductance L is adjusted by trimming the resistor $R_4$. Finally, the value of the input resistance R is adjusted by trimming the resistance $R_8$. If $R_8$ is made equal to the negative resistance of the balance of the network, then the input resistance R = O and the network simulates a lossless L-C network. Thus, this is the only impedance cancellation or constraint required to obtain an idealized series resonant network.

Figure 3:
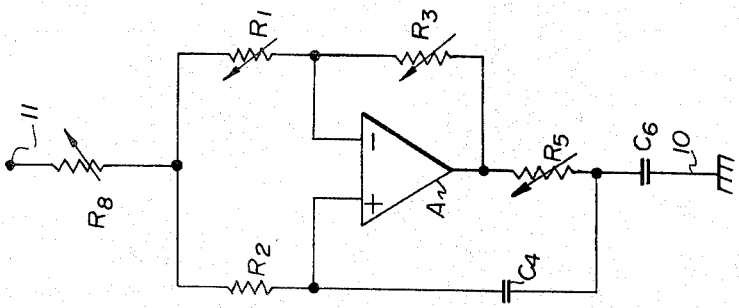
FIG. 3 is a schematic circuit diagram of another combination of resistors and capacitors for the admittances illustrated in FIG. 1 to simulate an R-D or an R-D-C network.

FIG. 3 illustrates a specific embodiment of the generalized immittance network in which the specific combination of passive elements in conjunction with the operational amplifier A simulates an R-D network or an R-D-C network, again depending upon the particular element values. The resistors and/or capacitors which are used for the admittances shown in FIG. 1 are as follows: the admittance $Y_1$ is a resistor $R_1$; the admittance $Y_2$ is a resistor $R_2$; the admittance $Y_3$ is a resistor $R_3$; the admittance $Y_4$ is a capacitor $C_4$; the admittance $Y_5$ is a resistor $R_5$; the admittance $Y_6$ is a capacitor $C_6$.

In this embodiment, admittances $Y_7 = O$, $Y_8 = \infty$ and hence the input impedance Z between terminals 10 and 11 reduces to:

$$Z = \frac{Y_2Y_3Y_4 + Y_2Y_3Y_5 + Y_2Y_3Y_6 + Y_3Y_4Y_6 - Y_1Y_4Y_5}{Y_3Y_4Y_6(Y_1 + Y_2)}$$

The realized input resistance R, frequency dependent negative resistance D and capacitance C of the network between terminals 10 and 11 are as follows:

$$R = \frac{R_1 R_2}{R_1 + R_2}$$

$$D = R_5 C_4 C_6 \left(1 + \frac{R_2}{R_1}\right)$$

$$C = \frac{\frac{C_4 C_6}{C_4 + C_6}\left(1 + \frac{R_2}{R_1}\right)}{1 - \frac{R_2}{R_5}\frac{R_3}{R_1}\left(\frac{C_4}{C_4 + C_6}\right)}$$

In order to tune this network in a unidirectional manner, the value of the input resistance R is first adjusted by trimming the resistor $R_1$. Thereafter the value of the frequency dependent negative resistance D is adjusted by trimming the resistor $R_5$. Finally, the value of the capacitance C is adjusted by trimming the resistor $R_3$. In a slightly modified embodiment, the circuit may include a resistor $R_8$ which is connected between the junction of the resistors $R_1$, $R_2$ and the input terminal 11. Either this resistor $R_8$ or $R_1$ can then be trimmed to obtain the desired input resistance R which is then equal to: $R = R_8 + R_1 R_2/R_1 + R_2$. Also, the value of resistor $R_3$ can be trimmed so that the input capacitance C is extremely large (i.e. essentially infinity) and the network then simulates a R-D resonator. Again therefore, only one impedance cancellation or constraint is required to obtain an idealized resonant network.

Figures 4, 5:
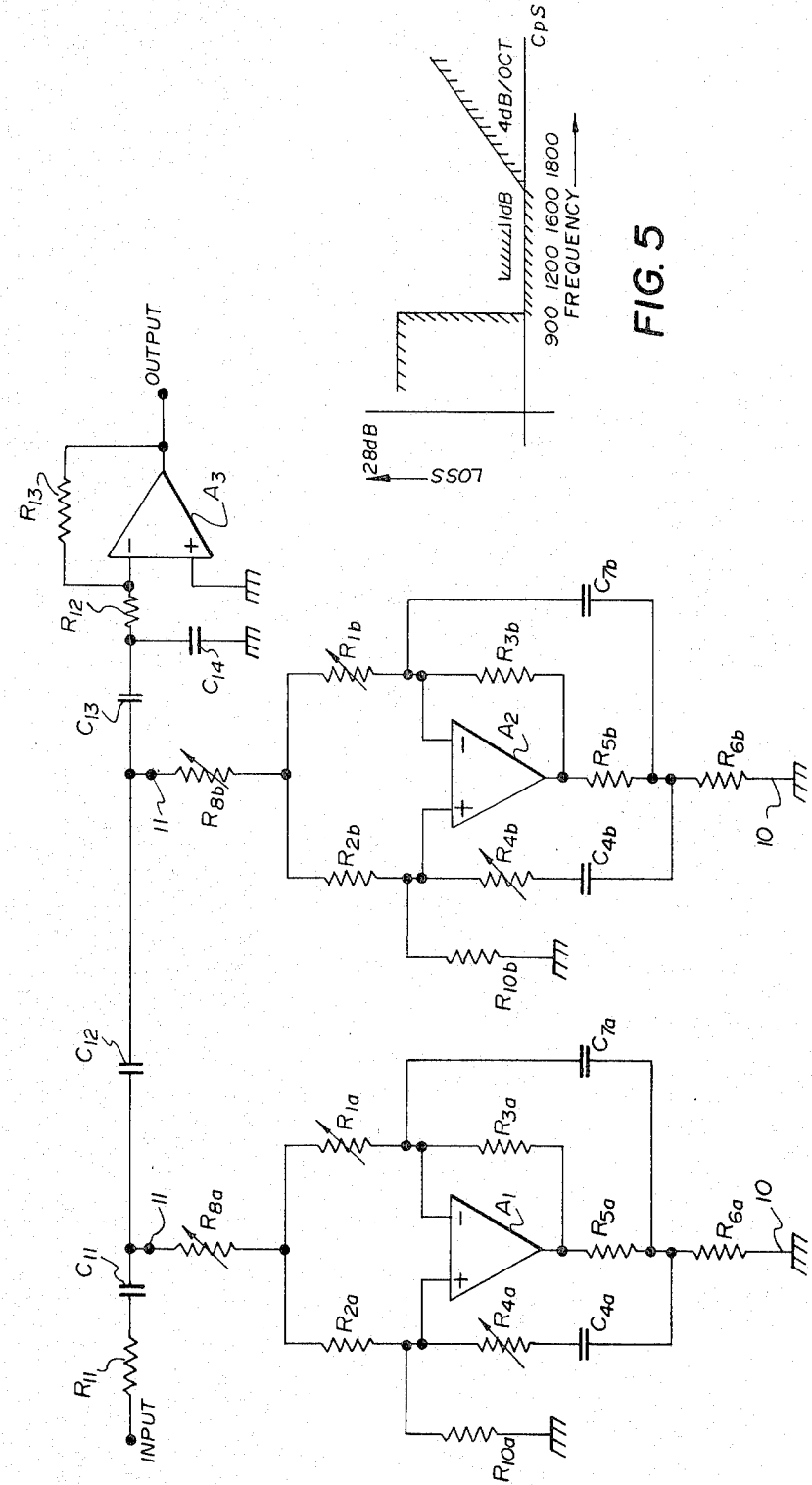
FIG. 4 illustrates a schematic circuit diagram of a band-pass filter utilizing two L-C simulation networks illustrated in FIG. 2.
FIG. 5 is a graph of the typical attenuation characteristics of the filter illustrated in FIG. 4.

FIG. 4 illustrates a typical application of the L-C network illustrated in FIG. 2 for use in a band-pass filter which is particularly adapted to pass the standard upper frequency group of signals used in telephone pushbutton dialling. Each of the elements in the two L-C simulation networks are identified by reference characters corresponding to those illustrated in FIG. 2 with additional reference characters being added to differentiate between the two networks. The additional very large valued resistors $R_{10}$ which have been added to the simulated networks are to provide d-c bias for the non-inverting input of the operational amplifiers A. The balance of the band-pass filter is of conventional design and hence will not be described in detail.

Typical component values for this band-pass filter, which utilizes simulated L-C networks, are as follows:

| | | | |
|---|---|---|---|
| $A_1, A_2, A_3$ | = type 741 | $R_{3a}, R_{6a}$ | = 35 KΩ |
| $C_{4a}, C_{4b}, C_{14}$ | = 3.9 nf | $R_{3b}, R_{4b}, R_{6b}$ | = 25 KΩ |
| $C_{7a}, C_{7b}$ | = 12 nf | $R_{4a}$ | = 32.4 KΩ |
| $C_{11}$ | = 1 nf | $R_{5a}$ | = 4.8 KΩ |
| $C_{12}$ | = 820 pf | $R_{5b}$ | = 2.97 KΩ |
| $C_{13}$ | = 3.3 nf | $R_{8a}$ | = 29.6 KΩ |
| $R_{1a}$ | = 2.33 KΩ | $R_{8b}$ | = 26 KΩ |
| $R_{1b}$ | = 3.93 KΩ | $R_{10a}, R_{10b}$ | = 20 MΩ |
| $R_{2a}$ | = 14 KΩ | $R_{11}$ | = 300 KΩ |
| $R_{2b}$ | = 22 KΩ | $R_{12}$ | = 34 KΩ |
| | | $R_{13}$ | = 200 KΩ |

This band-pass filter, when driven from a low impedance source, would meet the requirements illustrated in the graph of FIG. 5. The slashed areas represent the forbidden areas upon which the filter characteristics do not intrude.

Figures 6, 7:
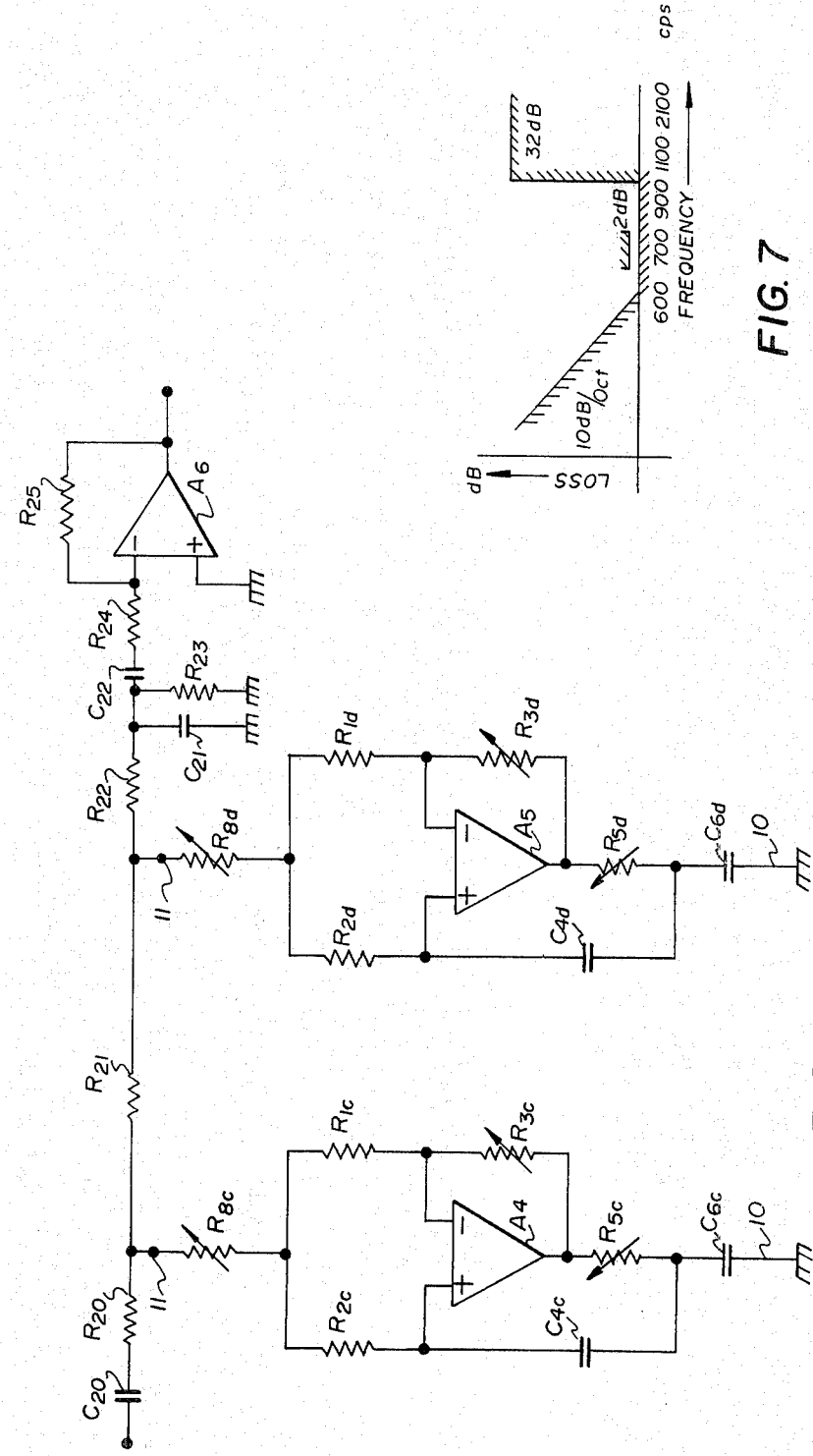
FIG. 6 is a schematic circuit diagram of a band-pass filter utilizing two of the R-D simulation networks illustrated in FIG. 3.
FIG. 7 is a graph of the typical attenuation characteristics of the filter illustrated in FIG. 6.

FIG. 6 illustrates a typical application of the R-D network illustrated in FIG. 3 for use in a band-pass filter which is particularly adapted to pass the standard lower frequency group of signals used in telephone pushbutton dialling. Each of the elements in the two R-D simulation networks are identified by reference characters corresponding to those illustrated in FIG. 3 with additional reference characters being added to differentiate between the two networks. The balance of the band-pass filter is of conventional design and hence will not be described in detail.

Typical component values for this band-pass filter, which utilizes simulated R-D networks, are as follows:

| | | | |
|---|---|---|---|
| $A_4, A_5, A_6$ | = type 741 | $R_{3d}$ | = 15.26 KΩ |
| $C_{4c}, C_{6c}, C_{21}$ | = 2.2 nf | $R_{5c}$ | = 17.95 KΩ |
| $C_{4d}, C_{6d}$ | = 2.7 nf | $R_{5d}$ | = 24 KΩ |
| $C_{20}$ | = 1 nf | $R_{8c}$ | = 20.2 KΩ |
| $C_{22}$ | = 1.2 nf | $R_{8d}$ | = 17.4 KΩ |
| $R_{1c}$ | = 12.26 KΩ | $R_{20}$ | = 153 KΩ |
| $R_{1d}$ | = 6.45 KΩ | $R_{21}$ | = 126 KΩ |
| $R_{2c}$ | = 24 KΩ | $R_{22}, R_{23}$ | = 20.6 KΩ |
| $R_{2d}$ | = 20.57 KΩ | $R_{24}$ | = 27 KΩ |
| $R_{3c}$ | = 20.87 KΩ | $R_{25}$ | = 200 KΩ |

This band-pass filter, when driven from a low impedance source, would meet the requirements illustrated in the graph of FIG. 7. The slashed areas represent the forbidden areas upon which the filter characteristics do not intrude.

The two band-pass filters illustrated in FIGS. 4 and 6 are readily realized using thick film technology in combination with standard off-the-shelf operational amplifiers. Computer programmed laser trimming can be employed to trim certain resistors (indicated as being variable) to provide the desired input characteristics of the simulated networks. Such techniques are well established in the art.

What is claimed is:
1. An immittance network comprising:
an input terminal and a common terminal;
an operational amplifier having an inverting input, a non-inverting input and an output;
first and second admittances ($Y_1$, $Y_2$) connected in series between said inverting and non-inverting inputs respectively;
a third admittance ($Y_3$) connected between said inverting input and said output;
fourth and fifth admittances ($Y_4$, $Y_5$) connected in series between said non-inverting input and said output respectively;
a sixth admittance ($Y_6$) connected between said common terminal and the junction of said fourth and fifth admittances ($Y_4$, $Y_5$);
a seventh admittance ($Y_7$) connected between said junction and said inverting input; and
an eighth admittance ($Y_8$) connected between the junction of the first and second admittances and the input terminal;
the values of said admittances having the relationship:

$$Z = \frac{1}{Y_8} + \frac{Y_2 Y_5 Y_7 + Y_2 Y_3 Y_4 + Y_2 Y_3 Y_5 + Y_2 Y_3 Y_7 + Y_2 Y_3 Y_6 + Y_3 Y_4 Y_6 - Y_1 Y_4 Y_5}{Y_3 Y_4 Y_6 (Y_1 + Y_2)}$$

where: Z = the input impedance of the network across said terminals.

2. An immittance network as defined in claim 1 which simulates a series resonant L-C-R network in which:
the admittance $Y_1$ is a resistor $R_1$;
the admittance $Y_2$ is a resistor $R_2$;
the admittance $Y_3$ is a resistor $R_3$;
the admittance $Y_4$ is a series connected resistor $R_4$ and a capacitor $C_4$;
the admittance $Y_5$ is a resistor $R_5$;
the admittance $Y_6$ is a resistor $R_6$;
the admittance $Y_7$ is a capacitor $C_7$; and
the admittance $Y_8$ is a resistor $R_8$;
the values of the resistors and capacitors having the relationship:

$$C = \frac{C_4 R_5 (R_1 + R_2)}{R_1 (R_5 + R_6)}$$

$$L = \frac{C_7 R_6 R_4 R_1 (R_5 + R_3)}{(R_2 + R_1) R_5}$$

$$R = R_8 + \frac{C_7 R_1 R_6 (R_3 + R_5) + C_4 R_1 (R_5 R_6 + R_4 R_6 + R_4 R_5) + C_4 R_2 (R_1 R_5 - R_3 R_6)}{C_4 R_5 (R_2 + R_1)}$$

where:
$C$ = the input capacitance of the network;
$L$ = the input inductance of the network; and
$R$ = the input resistance of the network.

3. An immittance network as defined in claim 2 in which the absolute value of the resistor $R_8$ equals the negative resistance of the balance of the network, whereby the input resistance $R = 0$.

4. An immittance network as defined in claim 2 having a unidirectional tuning sequence in which the resistor $R_1$ is first adjusted to obtain the input capacitance $C$, the resistor $R_4$ is then adjusted to obtain the input inductance $L$, and finally the resistor $R_8$ is adjusted to obtain the input resistance $R$.

5. An immittance network as defined in claim 1 which simulates a series connected R-D-C network in which:
the admittance $Y_1$ is a resistor $R_1$;
the admittance $Y_2$ is a resistor $R_2$;
the admittance $Y_3$ is a resistor $R_3$;
the admittance $Y_4$ is a capacitor $C_4$;
the admittance $Y_5$ is a resistor $R_5$;
the admittance $Y_6$ is a capacitor $C_6$;
the admittance $Y_7$ is an open circuit; and
the admittance $Y_8$ is a resistor $R_8$;
the values of the resistors and capacitors having the relationship:

$$R = R_8 + \frac{R_1 R_2}{R_1 + R_2}$$

$$D = R_5 C_4 C_6 \left(1 + \frac{R_2}{R_1}\right)$$

$$C = \frac{\frac{C_4 C_6}{C_4 + C_6}\left(1 + \frac{R_2}{R_1}\right)}{1 - \frac{R_2}{R_5}\frac{R_3}{R_1}\left(\frac{C_4}{C_4 + C_6}\right)}$$

where:
$R$ = the input resistance of the network;
$D$ = the input frequency dependent negative resistance of the network; and
$C$ = the input capacitance of the network.

6. An immittance network as defined in claim 5 in which the input capacitance $C$ of the network is essentially infinity.

7. An immittance network as defined in claim 5 having a unidirectional tuning sequence in which the resistor $R_1$ is first adjusted to obtain the input resistance $R$, the resistor $R_5$ is then adjusted to obtain the frequency dependent negative resistance $D$, and finally the resistor $R_3$ is adjusted to obtain the input capacitance $C$.

8. An immittance network which simulates a series connected R-D-C network, comprising:
an input terminal and a common terminal;
an operational amplifier having an inverting input, a non-inverting input and an output;
first and second admittances ($Y_1$, $Y_2$) connected in series between said inverting and non-inverting inputs respectively, means for connecting the junction of said admittances to said input terminal;
a third admittance ($Y_3$) connected between said inverting input and said output;
fourth and fifth admittances ($Y_4$, $Y_5$) connected in series between said non-inverting input and said output respectively;
a sixth admittance ($Y_6$) connected between said common terminal and the junction of said fourth and fifth admittances ($Y_4$, $Y_5$);
the values of said admittances having the relationship:

$$Z = \frac{Y_2 Y_3 Y_4 + Y_2 Y_3 Y_5 + Y_2 Y_5 Y_6 + Y_3 Y_4 Y_6 - Y_1 Y_4 Y_5}{Y_3 Y_4 Y_6 (Y_1 + Y_2)}$$

where:
$Z$ = the input impedance of the network across said terminals;
the admittance $Y_1$ being a resistor $R_1$;
the admittance $Y_2$ being a resistor $R_2$;
the admittance $Y_3$ being a resistor $R_3$;
the admittance $Y_4$ being a capacitor $C_4$;
the admittance $Y_5$ being a resistor $R_5$;
the admittance $Y_6$ being a capacitor $C_6$;
the values of the resistors and capacitors having the relationship:

$$R = \frac{R_1 R_2}{R_1 + R_2}$$

$$D = R_5 C_4 C_6 \left(1 + \frac{R_2}{R_1}\right)$$

$$C = \frac{\frac{C_4 C_6}{C_4 + C_6}\left(1 + \frac{R_2}{R_1}\right)}{1 - \frac{R_2}{R_5}\frac{R_3}{R_1}\left(\frac{C_4}{C_4 + C_6}\right)}$$

where:
$R$ = the input resistance of the network;
$D$ = the input frequency dependent negative resistance of the network; and
$C$ = the input capacitance of the network.

* * * * *